United States Patent [19]
Brown

[11] Patent Number: 5,758,330
[45] Date of Patent: May 26, 1998

[54] EPM HAVING AN IMPROVEMENT IN NON-VOLATILE MEMORY ORGANIZATION

[75] Inventor: Nanette Brown, Orange, Conn.

[73] Assignee: Pitney Bowes Inc., Stamford, Conn.

[21] Appl. No.: 109,982

[22] Filed: Aug. 23, 1993

Related U.S. Application Data

[63] Continuation of Ser. No. 827,911, Jan. 31, 1992, abandoned, which is a continuation of Ser. No. 292,195, Dec. 30, 1988, abandoned.

[51] Int. Cl.$^6$ .................................................. G07B 17/00
[52] U.S. Cl. .................................................. 705/405
[58] Field of Search ............ 364/464.02, 464.03; 371/21.6; 705/400, 401, 405, 410

[56] References Cited

U.S. PATENT DOCUMENTS

| | | | |
|---|---|---|---|
| T104,003 | 3/1984 | Hall et al. .............................. | 364/200 |
| 4,527,251 | 7/1985 | Nibby, Jr. et al. ....................... | 364/900 |
| 4,535,419 | 8/1985 | Dlugos et al. .................. | 364/464.03 X |
| 4,713,769 | 12/1987 | Hills et al. .......................... | 364/464.02 |
| 4,802,117 | 1/1989 | Chrosny et al. ........................ | 364/900 |
| 4,939,719 | 7/1990 | Bakka ...................................... | 370/60 |
| 4,939,720 | 7/1990 | Bakka ...................................... | 370/60 |
| 5,233,614 | 8/1993 | Singh ...................................... | 371/216 |

*Primary Examiner*—Edward R. Cosimano
*Attorney, Agent, or Firm*—Angelo N. Chaclas; Charles G. Parks, Jr.; Melvin J. Scolnick

[57] ABSTRACT

An electronic postage meter has non-volatile memories storing postage meter data under control of the CPU operating from a program in ROM. The data in non-volatile memory is organized into buffers of related data for ease of access. The memory is segmented and such segment has a corresponding bit in a bit map buffer which may be turned on or off in accordance with the good or bad status of the segment. The ROM stores initial entry into the non-volatile memory which is updated in the CPU's working memory in accordance with the data stored in the bit map buffer of the non-volatile memory.

3 Claims, 19 Drawing Sheets

FIG. 4A

BASE ADDRESS = 2000H  CMOS OVERVIEW

| ADDRESS (HEX) | DESCRIPTION | |
|---|---|---|
| 2000 – 207F | BITMAP SECTION<br>4 32-BYTE BUFFERS<br>BYTES: 128 DECIMAL, 80 HEX | 200 |
| 2080 – 227F | TRIP INFO<br>16 32-BYTE BUFFERS<br>BYTES: 512 DECIMAL, 200 HEX | 210 |
| 2280 – 22FF | RECOVERY INFO MAIN<br>4 32-BYTE BUFFERS<br>BYTES: 128 DECIMAL, 80 HEX | 220 |
| 2300 – 237F | RECOVERY INFO ALT<br>4 32-BYTE BUFFERS<br>BYTES: 128 DECIMAL, 80 HEX | 220' |
| 2380 – 23FF | RECHARGE INFO<br>4 32-BYTE BUFFERS<br>BYTES: 128 DECIMAL, 80 HEX | 230 |
| 2400 – 243F | PARAM INFO<br>2 32-BYTE BUFFERS<br>BYTES: 64 DECIMAL, 40 HEX | 270 |
| 2440 – 24BF | FATAL INFO<br>4 32-BYTE BUFFERS<br>BYTES: 128 DECIMAL, 80 HEX | 240 |
| 24C0 – 24FF | CONFIG INFO<br>2 32-BYTE BUFFERS<br>BYTES: 64 DECIMAL, 40 HEX | 250 |
| 2500 – 257F | NON-CRIT-1 INFO<br>4 32-BYTE BUFFERS<br>BYTES: 128 DECIMAL, 80 HEX | 280 |
| 2580 – 25FF | NON-CRIT-2 INFO<br>4 32-BYTE BUFFERS<br>BYTES: 128 DECIMAL, 80 HEX | 280' |

FIG. 4C

BASE ADDRESS = 4000H                                         EEPROM OVERVIEW

| ADDRESS (HEX) | DESCRIPTION | |
|---|---|---|
| 4000 – 407F | BITMAP SECTION — 4 32-BYTE BUFFERS — BYTES: 128 DECIMAL, 80 HEX | 300 |
| 4080 – 408F | FREE SPACE AREA — BYTES: 16 DECIMAL, 10 HEX | 390 |
| 4090 – 4093 | ONE-TIME INITIALIZATION FLAG, BAD_BATT_CNT AND DEVICE STATUS BYTES — BYTES: 4 DECIMAL, 4 HEX | 360 |
| 4094 – 40FF | FREE SPACE AREA — BYTES: 108 DECIMAL, 6C HEX | 393 |
| 4100 – 4DFF | TRIP INFO — 104 32-BYTE BUFFERS — BYTES: 3328 DECIMAL, D00 HEX | 310 |
| 4E00 – 4E7F | RECHARGE INFO — 4 32-BYTE BUFFERS — BYTES: 128 DECIMAL, 80 HEX | 330 |
| 4E80 – 4EBF | PARAM INFO — 2 32-BYTE BUFFERS — BYTES: 64 DECIMAL, 40 HEX | 370 |
| 4EC0 – 4F3F | FATAL INFO — 4 32-BYTE BUFFERS — BYTES: 128 DECIMAL, 80 HEX | 340 |
| 4F40 – 4F7F | CONFIG INFO — 2 32-BYTE BUFFERS — BYTES: 64 DECIMAL, 40 HEX | 350 |
| 4F80 – 4FFF | FREE SPACE AREA — BYTES: 128 DECIMAL, 80 HEX | 395 |

EPM HAVING AN IMPROVEMENT IN NON-VOLATILE MEMORY ORGANIZATION

This application is a continuation of application Ser. No. 07/827,911, filed Jan. 31, 1992, now abandoned, which is a continuation of application Ser. No. 07/292,195, filed Dec. 30, 1988, now abandoned.

RELATED APPLICATIONS

The following patent applications include material similar to that disclosed in the instant application: EPM HAVING AN IMPROVEMENT IN ACCOUNTING UPDATE SECURITY, U.S. Pat. No. 5,021,963, filed Dec. 30, 1988, and EPM HAVING AN IMPROVEMENT IN NON-VOLATILE STORAGE OF ACCOUNTING DATA, U.S. Pat. No. 5,012,425, filed Dec. 30, 1988.

FIELD OF THE INVENTION

The invention relates to electronic postage meters and more particularly to the storage of data in non-volatile memory in such electronic postage meters.

BACKGROUND OF THE INVENTION

Electronic postage meters are well known. Such devices operate under microprocessor control to perform printing and accounting operations associated with the printing of a postal indicia on an envelope. Such accounting is usually carried out in a volatile memory and then transferred at a predetermined time to non-volatile memory for storage in the event that power is removed from the electronic postage meter.

Random events may cause data within non-volatile memories to be incorrectly read or written. In postage meter operation, it is extremely important that such events be detected and the READ or WRITE operation be retried. If the incorrect READ or WRITE is determined to be a result of a problem with the memory device, the data must be reconstructed, for instance in the case of a failed read, and then relocated to a different part of non-volatile memory. U.S. application Ser. No. 809,454, filed Dec. 16, 1985, now U.S. Pat. No. 4,802,117, entitled ELECTRONIC MEMORY SYSTEM and assigned to the assignee of the instant application, teaches a partitioning of non-volatile memory into several blocks and storing all the postage meter information in one of said blocks. If any given register within a partitioned block is bad, a new copy of the entire block of data is constructed in another partitioned block of non-volatile memory and that partitioned area with the corrupt register is marked BAD. While this method works well, it will be appreciated that it is a extremely wasteful of space in memory. Also, as brought out in the teaching of this application, each data item stored in the block requires its own CRC for determination of whether the register data is corrupt.

The data in each register is not necessarily related to the data in an adjacent register. In order to complete a non-volatile memory update of the accounting for a postage meter trip under these circumstances, there have been required a large number of individual non-volatile memory read-outs and writes to memory to update the necessary data.

SUMMARY OF THE INVENTION

It is an object of the invention to provide a relocation of failed memory data which causes as little disruption as possible to a normal memory organization and access mechanisms.

A second object is to assure that when taking failed portions of memory out of service, the relocation process minimizes the amount "good" memory which is made unavailable.

In accordance with the invention, data within the electronic postage meter is stored within (2) two non-volatile memory devices. These two (2) devices, preferably, use separate memory technologies (CMOS and E$^2$PROM) is to guard against the possibility of a dual device failure. The data in each device is organized by segmenting each device into a set of data structures, which are referred to as "stores". Each store has one or more buffer. Each buffer contains a set of one or more related data items. Preferably, every data buffer is fixed at 32 bytes in length.

For best results, each data buffer, as opposed each data item, in the buffer has an attached CRC. A single CRC is computed across all the data items within the buffer. If the buffer contains unused space, the CRC calculation will not include the unused bytes.

Each of the non-volatile memories also includes a BAD segment data store. This data store contains a bit map indicating "good" and "bad" elements within the device. Preferably, each segment in the device has a corresponding bit within the BAD segment data store. This bit is turned ON or OFF to indicate whether the corresponding segment can be used. For best results, each device maintains a copy of the bit map for its own device only.

In order to access the data stores, each will have an entry in a ROM table. This ROM table contains information about the data store characteristics including the beginning address of the store and such things, if desired, as the number of segments which must be available in order for the system to continue reliable operation. For each data store, a pointer to the current buffer is kept in scratch pad RAM. These pointers are initialized at power-up and are updated each time a buffer advance is necessary.

Further features and advantages of the method and apparatus in accordance with the invention will be understood from the description of the drawing.

DESCRIPTION OF THE PREFERRED EMBODIMENT

Figure 1:
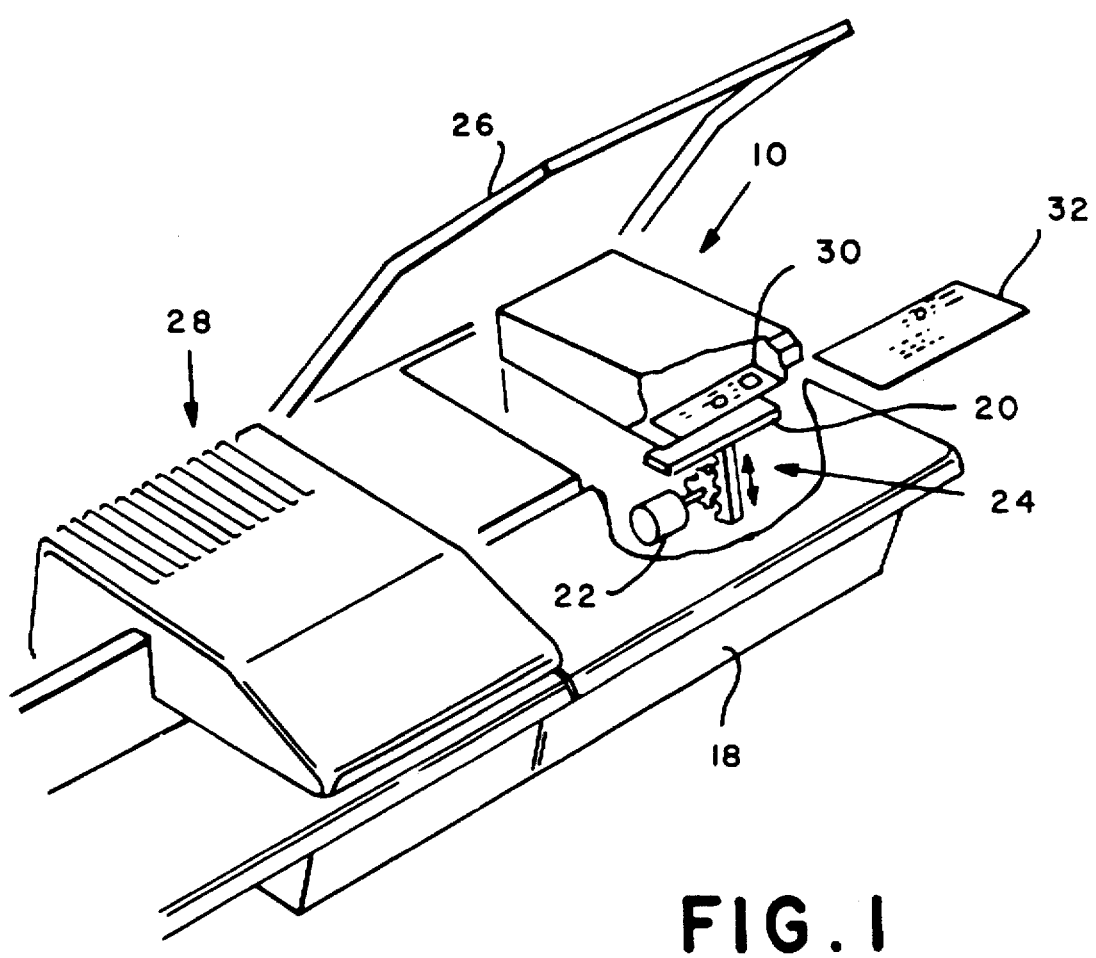
FIG. 1 is a perspective view of an electronic postage meter in which the invention may reside.

In FIG. 1, there is shown an electronic postage meter at 10. The meter 10 may have a keyboard and display (not shown in this figure) suitably covered by a door or a sliding fixture (also not shown). The meter 10 is shown installed in position on a mailing machine 18. The mailing machine 18 includes, as schematically shown, a printing platen 20 driven by motor 22 which reciprocates platen 20, suitably via rack and pinion gears 24. The entire meter is suitably enclosed in the mailing machine by hinged cover 26. Feeder module 28 feeds mailpieces to the base 18 which in turn transports the mailpiece to the space between the print die 30 and the platen 20 where upon reciprocation of the platen an imprinted indicia is placed upon the mailpiece as shown on mailpiece 32 being ejected from the mailing machine 18.

Printwheels (not shown), set by stepping motors (also not shown), are arranged to print postage value on the envelope in conjunction with the remainder of the indicia. Further aspects of this meter are detailed in U.S. application Ser. No. 114,363, filed Oct. 27, 1987, now U.S. Pat. No. 4,876,956 entitled A REMOVABLE POSTAGE METER HAVING AN INDICIA COVER, assigned to the assignee of the present invention.

Figure 2:
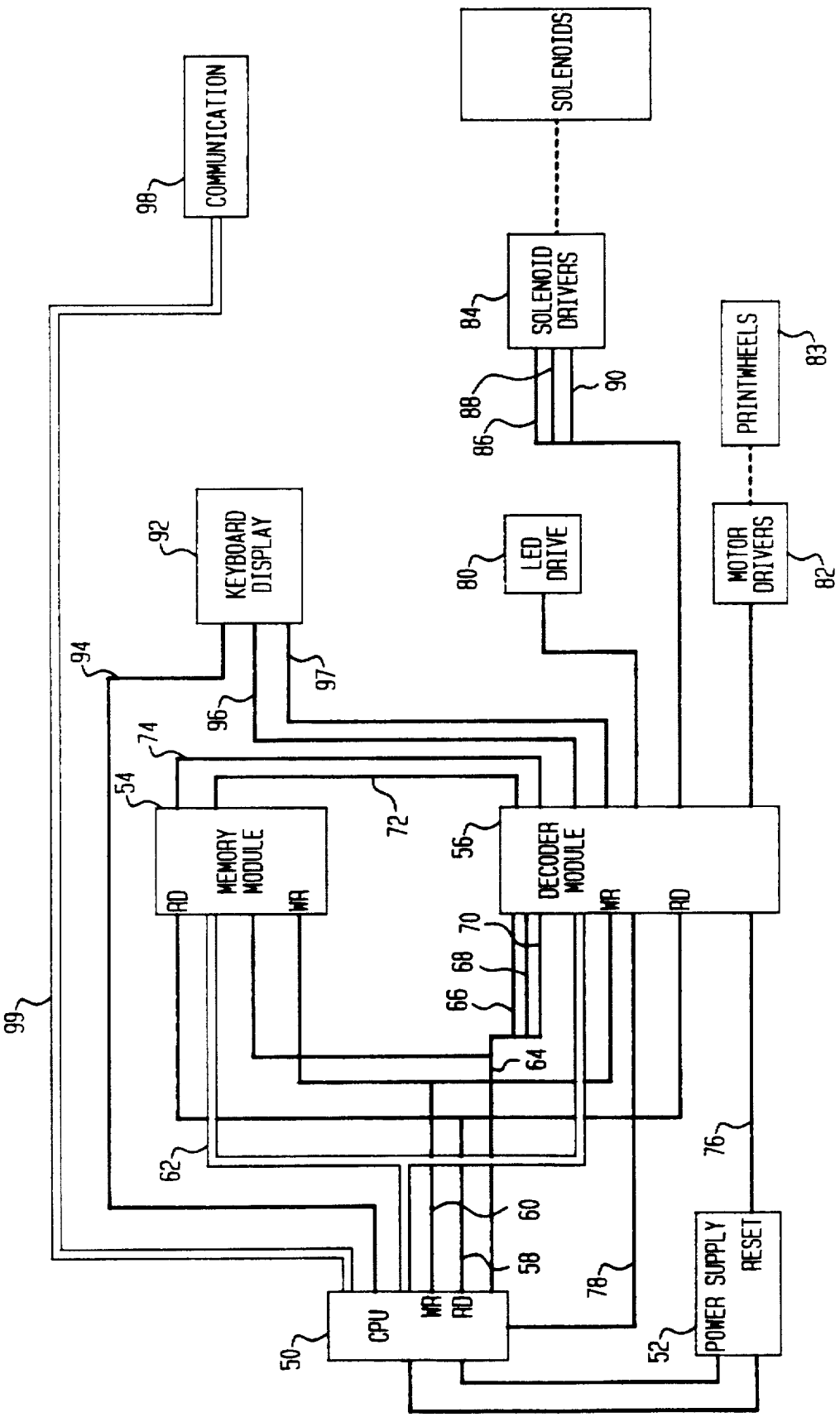
FIG. 2 is a schematic block diagram of the electronic postage meter.

FIG. 2 is a circuit block diagram of the electronic postage meter. As seen in FIG. 2, the Central Processing Unit (CPU) 50, suitably a Model 8031 available from Intel, Santa Clara, Calif., receives its power from the power supply 52. The CPU 50 communicates address and data signals along with memory READ and WRITE signals in known manner to memory module 54 as well as to the decoder module 56. Read signals are transmitted to both on line 58 and WRITE signals on line 60, respectively. The multiplex address/data bus between the modules is shown at 62. Address bus 64 is also connected between the CPU 50 and memory module 54. The three highest order address lines 66, 68, and 70 are also connected to the decoder module 56. NVM READ and NVM WRITE signals are developed in the decoder module 56 under command of the CPU 50 and are connected to memory module 54 on lines 72 and 74.

The decoder 56 receives a CPU reset signal from power supply 52 on line 76 and with suitable internal logical manipulation in combination with other developed signals in the decoder module 56 provides a CPU reset signal to CPU 50 on line 78. A suitable circuit for providing a reset signal dependent on power and voltage conditions in the power supply is shown, for example, in U.S. Pat. No. 4,547,853. A logic circuit for monitoring the reset from the power supply as well as other circuit parameters for developing a reset signal to the CPU is shown, for example in U.S. Pat. No. 4,747,057. A decoder chip is described in U.S. Pat. No. 4,710,882. As illustrated, the CPU 50 further communicates with LED drive module 80 to provide signals for the various sensors, the various stepper motor drivers (shown at 82) for positioning the postage meter printwheels (shown at 83), and solenoid drivers shown at 84 for controlling die-protector solenoids along lines 86, 88, and 90, respectively, through the decoder 56.

Keyboard display module 92 receives and displays information to the CPU 50 in conventional manner on line 94. Information is also provided from the keyboard of the keyboard/display module 92 to decoder 56 along line 96 in response to a strobe from the decoder 56 on line 97. External communications to the CPU are channelled through communication module 98 to the CPU on line 99. Typical features and the operation of postage meters are discussed, for example, in U.S. Pat. No. 4,301,507 and U.S. Pat. No. 4,484,307, both herein specifically incorporated by reference, and will not be further discussed.

Figure 3:
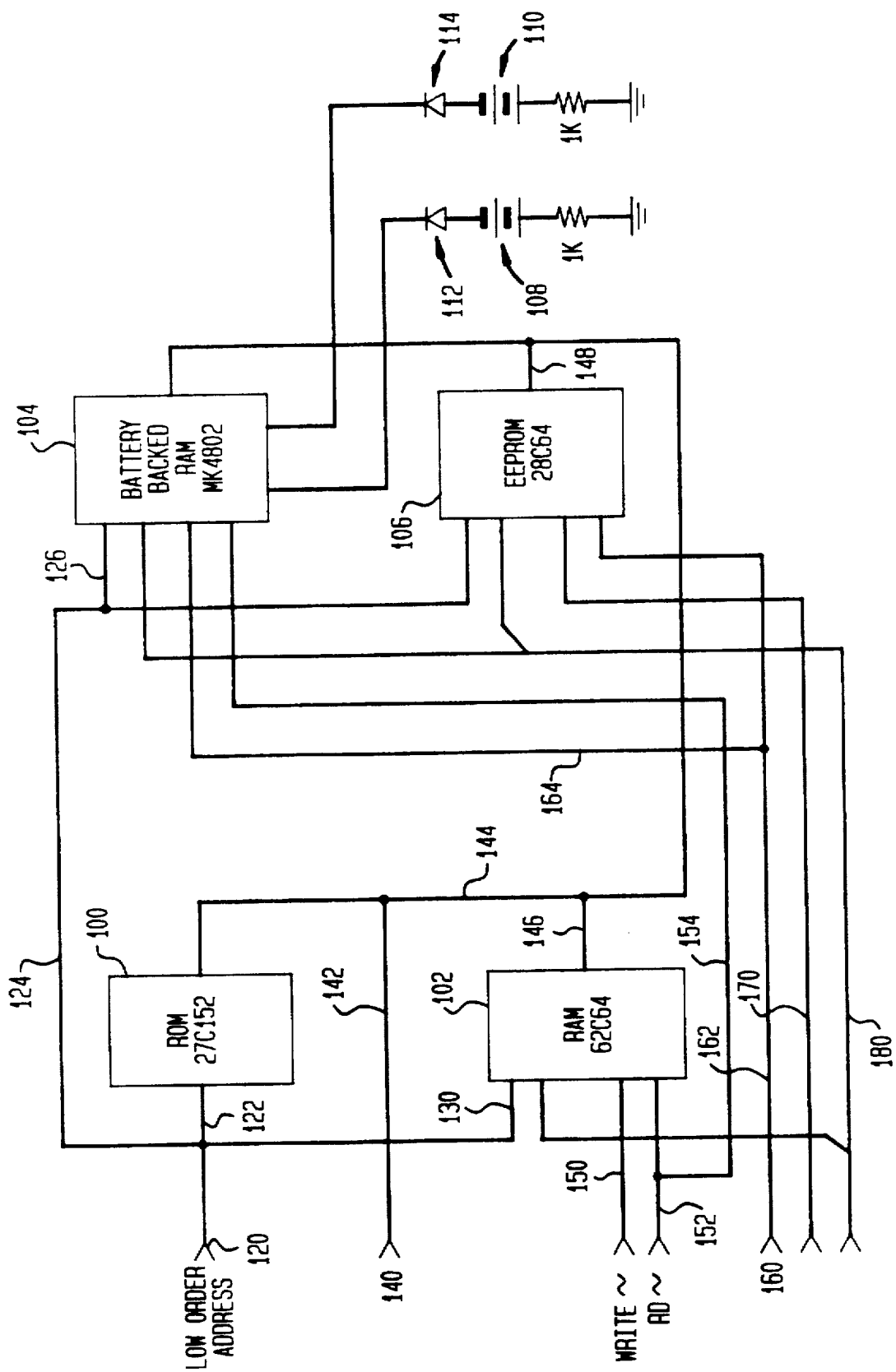
FIG. 3 is a circuit diagram of the memory module in the electronic postage meter.

FIG. 3 is a block diagram of the memory module 54 in the electronic postage meter. Memory module 54 comprises a Read Access Memory (ROM) 100 suitably Model 27C152 available from General Instruments, a CMOS random access memory (RAM) 102 such as Model number 62C64 available from NEC, a battery-backed RAM CMOS for non-volatile memory suitably Model number MK4802, available for example, from Mostek, at 104, and an $E^2PROM$ device 106 suitably a Model 28C64 available, for example, from Atmel. For best results, the battery-backed RAM 104 is connected to receive voltages from batteries 108 and 110, each connected through diode 112 and 114, respectively, to the battery-backed RAM 104. Low order address data is furnished to each of the memories at input point 120 and is transmitted along connecting busses shown at 122, 124, 126, and 130. Multiplexed address and data are communicated to the module at input point 140 and communicated to the various memory devices along connecting busses shown at 142, 144, 146, and 148. The WRITE signal to RAM 102 is provided on line 150. A READ signal is sent along line 152 to both the RAM 102 and battery-backed RAM 104 on line 154. Non-volatile memory WRITE signal from the decoder 56 is provided at point 160 on lines 162 and 164. $E^2PROM$ 106 is READ under control of the signal on line 170. Memory 102, 104, 106 are selected as required by chip enable signals on line 180.

For best results, data within the postage meter is stored in the two (2) non-volatile memory devices. Each device uses separate memory technology (CMOS and $E^2PROM$) to help guard against the possibility of a dual device failure or a bad manufacturing lot. All critical information within the system is maintained redundantly in both the CMOS battery-backed RAM 104 and the $E^2PROM$ 106. In accordance with the invention any update of critical data within the CMOS non-volatile memory is immediately followed by a corresponding update or copy to the $E^2PROM$ non-volatile memory. The redundancy allows data located in a "bad" section of either of the memories to be re-created from information in the alternate memory device as described below.

Figure 4B:
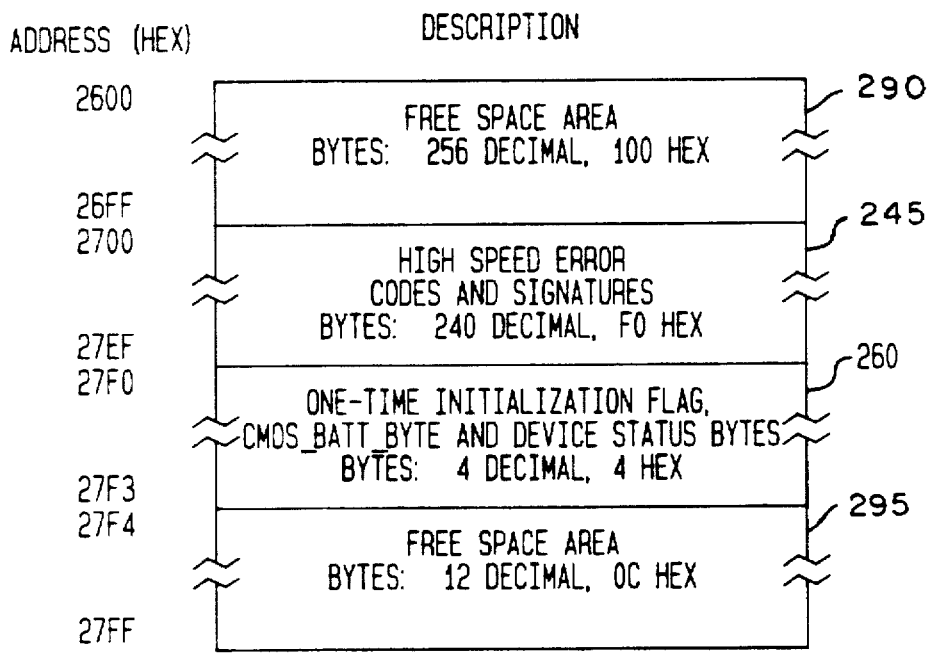
FIGS. 4A, 4B, 4C, and 4D comprise maps of non-volatile memory registers.
Figure 4D:
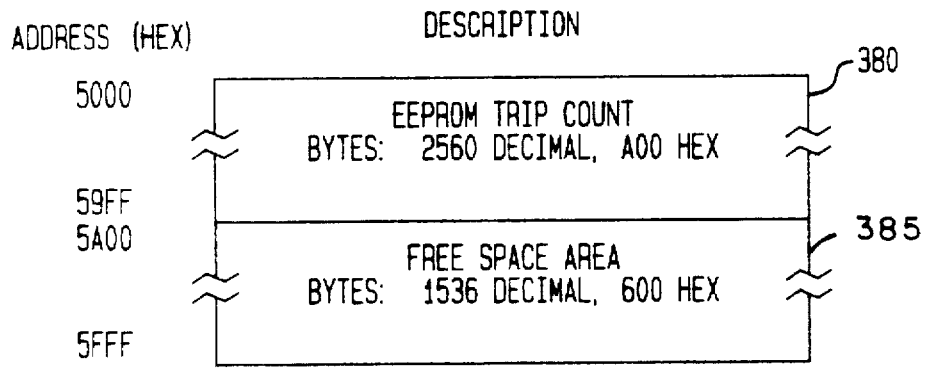
Figure 4E:
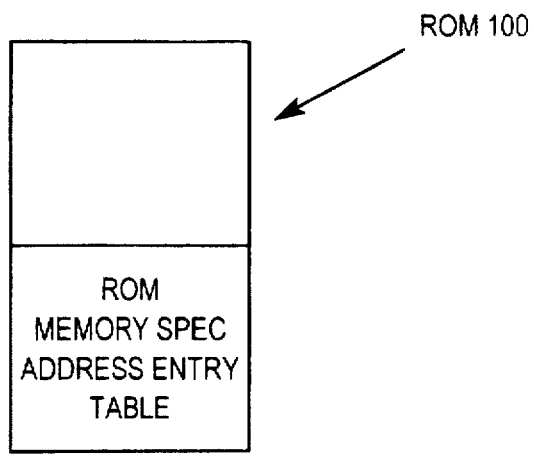
FIG. 4 illustrates schematically the ROM store locations describe in Table I of the Appendix.

FIG. 4A and 4B are a map of the addresses of pertinent or buffers of CMOS battery backed memory 104 (FIG. 3), while FIGS. 4C and 4D are a map of the addresses of the registers of $E^2PROM$ 106 (FIG. 3).

As seen in FIGS. 4A through 4D, each device is segmented into a set of data structures which are referred to herein as "stores". Each data store has one or more "buffers". Each buffer contains a set of one or more related data items. Thus, within a given store, each buffer will contain data items of the same type. The buffers within a given store are structurally identical, although the information content may vary between the buffers.

The storage of related data items means that the data needed, for instance, for calculation in a particular operation may be retrieved in a more simplified manner than has previously been the case.

Every data buffer is preferably fixed at 32 bytes in length. Even if the sum of the length of the data items in the store is less than 32 bytes, the remaining space will be unused. In accordance with the invention, each given data store uses either a "circular" or "ascending" buffer organization. If a data store uses a circular buffer organization, then prior to any update, an advance will be made to the next buffer in the store. After the last buffer in the store has been updated, the buffer pointer will loop back to the first buffer in the store.

Circular buffers are implemented for a store when either it is necessary to maintain a history on the data items in either the CMOS or the $E^2PROM$ store or it is expected that the number of times that a given data item in the E²PROM store will be updated could exceed the endurance level of the E²PROM chip. It will be appreciated that in order to allow such a circular buffer organization, the data store must contain one (1) strictly increasing data item. This means that the value of this data item will increase each time a buffer is written to the store.

In accordance with the present invention, a data store will use an ascending buffer organization whenever a circular buffer is not required. For such an ascending buffer, advance to the next buffer is only made when there is a non-recoverable hardware failure within a current buffer address range. That is, there will be a no advance to the next buffer prior to an update of information.

For best results, each data buffer will have an attached cyclic redundancy code (CRC) calculated. A single CRC is computed across all of the data items within the buffer. If the buffer contains unused space, the CRC calculation does not include such unused bytes. It will be appreciated that the calculation of a single CRC for the entire buffer will save considerable space over that required for CRC's for each data item.

Each of the non-volatile memory devices 104 and 106 are divided into 32 byte segments. Each buffer begins on the segment boundary.

The lowest address space of each device is occupied by a bad segment data store. It will be understood that this data store could be located at other addresses as desired. This data store contains a bit map indicating good and bad segments within the device. Each segment of the device has a corresponding bit within the bad segment data store. This bit is turned on or off to indicate whether the corresponding segment can be used. For best results, each device maintains four (4) copies of the bit map for its own device only. That is, the copies of the CMOS bit map are stored only in the CMOS device and for the E²PROM, the bit map copies are stored only in the E²PROM device. The bit maps are seen in FIG. 4A at 200 and FIG. 4C at 300.

Each data store preferably has an entry in a ROM table. Table 1 in the Appendix hereto illustrates an example of such a ROM table. It contains information about data store characters. For each data store, the table contains information such as: organization, number of data bytes per buffer, beginning address of the store, ending address, the minimum number of segments which must be available in order for the system to continue reliable operation and whether the store resides in CMOS memory only or in both the CMOS and E²PROM memories.

As discussed further below, for each data store, a pointer to the current buffer in that store is kept in RAM. These pointers are initialized at power up and are updated each time a buffer advance is necessary. Table 1 also shows these store definitions which contain the changing information about acceptable access to the memory structures.

As also seen in Table 1, each non-volatile memory data store suitably has a corresponding buffer in RAM for use when reading or writing to the devices. The buffers in the CMOS and E²PROM NVMs shown in FIGS. 4A through 4D, indicate the postage meter trip information at 210 and 310, recovery information initialization 220 and 220', recharge information 230 and 330, error information 240, 245 and 340, configuration information 250 and 350 flags and device status 260 and 360, and data as to the parameters of the particular meter, 270 and 370. Additionally, there are a main and alternate store in CMOS memory for storing non-critical data (280 and 280') while in the E²PROM there is a 2560 byte store for the Trip Count, shown at 380. The trip information includes 6 bytes of funds in the ascending register plus 5 bytes of funds in the descending register: the piece count has 4 bytes, batch count has 3 bytes, batch amount 6 bytes of funds, and the postage value set requires 3 bytes. The areas indicated at 290, 295, 390, 385, 393, and 395 are free space and store no data.

In addition to containing accounting information, each buffer in the accounting data store will also contain a pointer to a buffer in a circular "print counter" store in the E²PROM. Preferably, this circular data store will be a least 2000 bytes in length and will be organized into 2 byte buffers. Each buffer contains 2 redundant counters. These counters will be incremented each time a print cycle occurs.

In accordance with the method for updating disclosed herein, the current value of the meter registers will not necessarily be directly readable from the E²PROM. Rather, the meter register contents are calculated using data from both the accounting store and the print counter store in the E²PROM. The calculations to be used in determining the register values are as follows:

1. ascending register value=ascending register value in data store+(postage value*print counter value)
2. descending register=descending register value in data store 31 (postage value*print counter value)
3. batch amount=batch amount+(postage value*print counter value)
4. piece count=piece count+print counter value
5. batch count=batch count+print counter value It will be seen that if the print counter value is 0, the values will be those stored in the accounting data store.

Figure 10A:
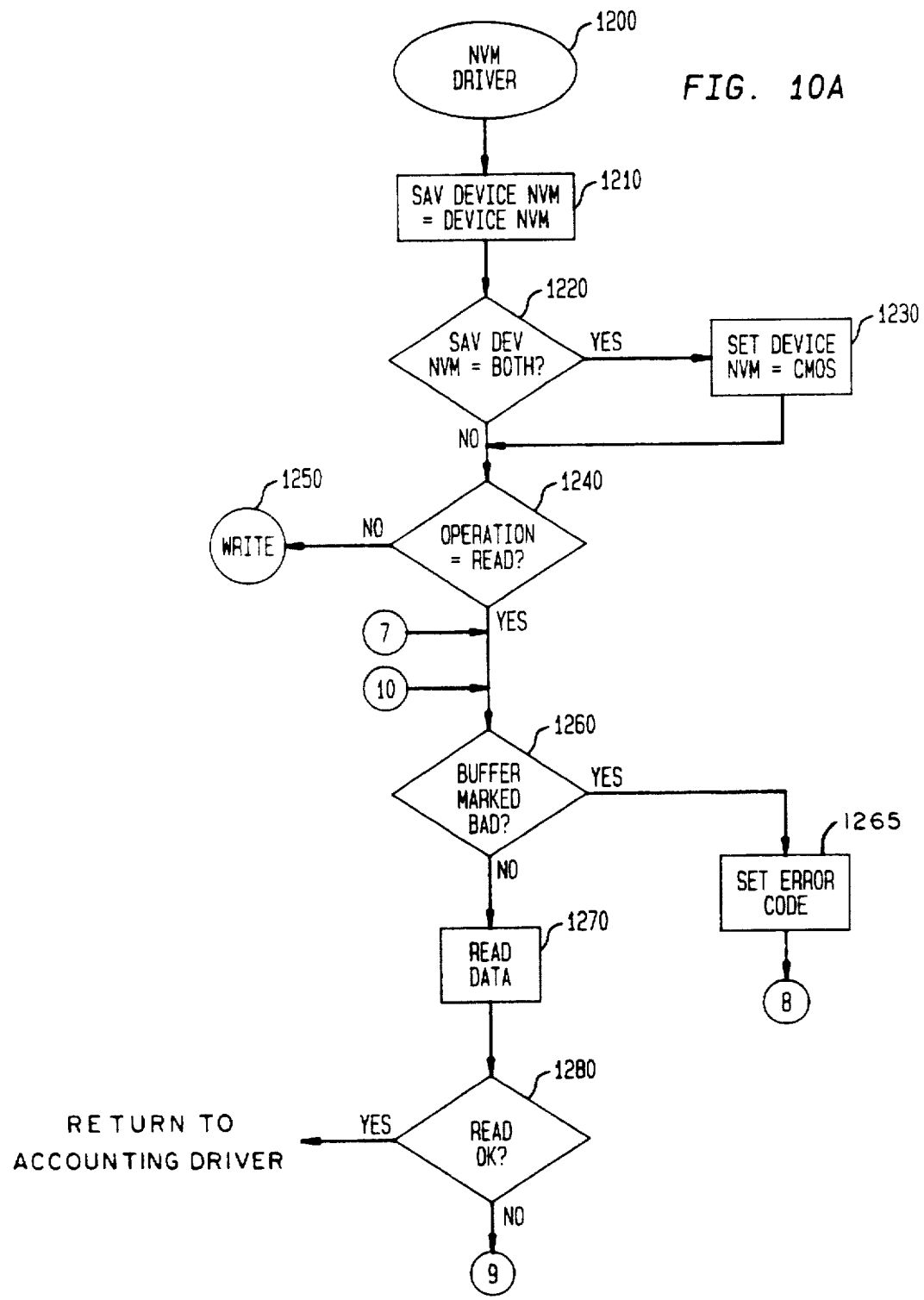
Figure 10B:
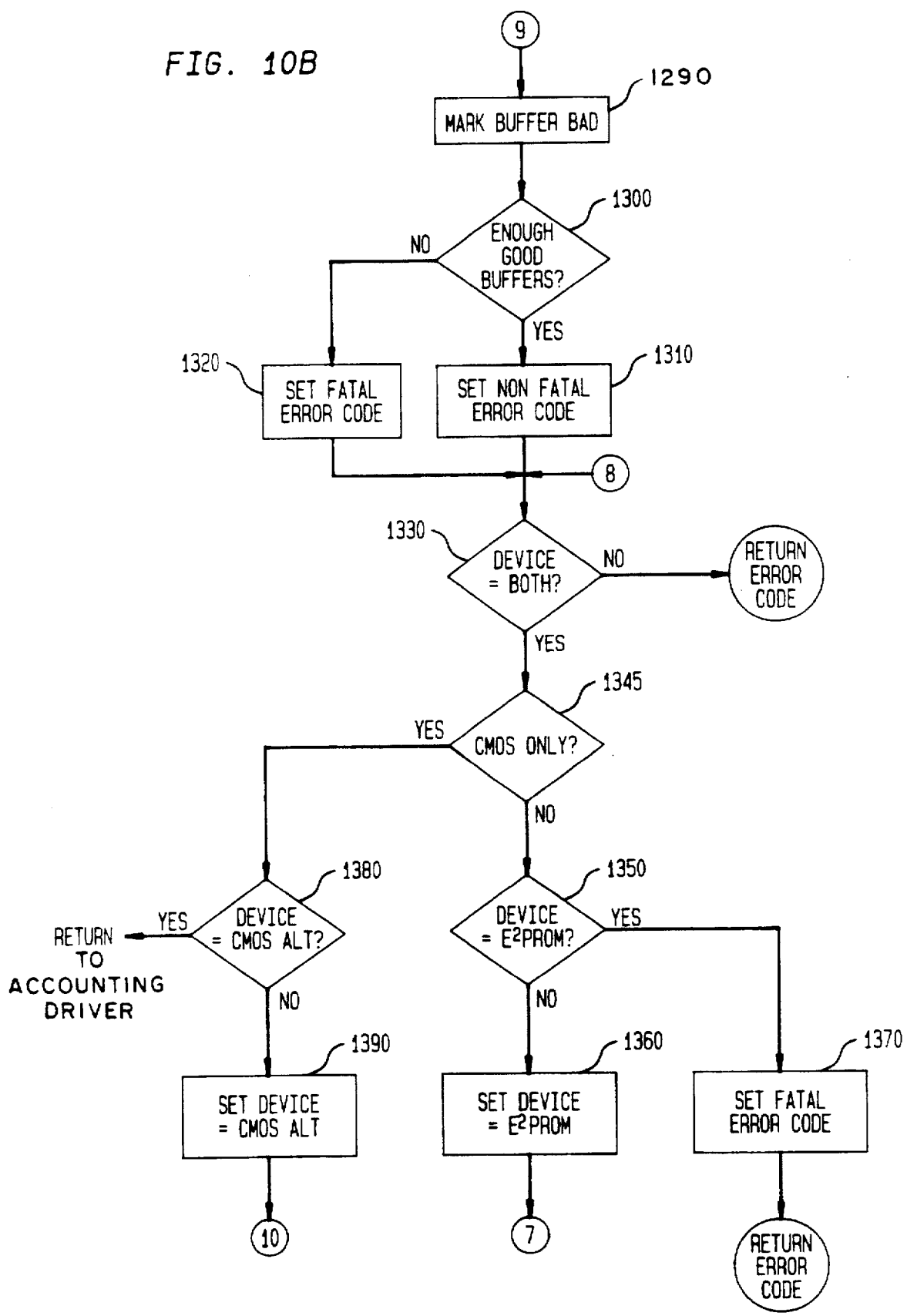
Figure 11:
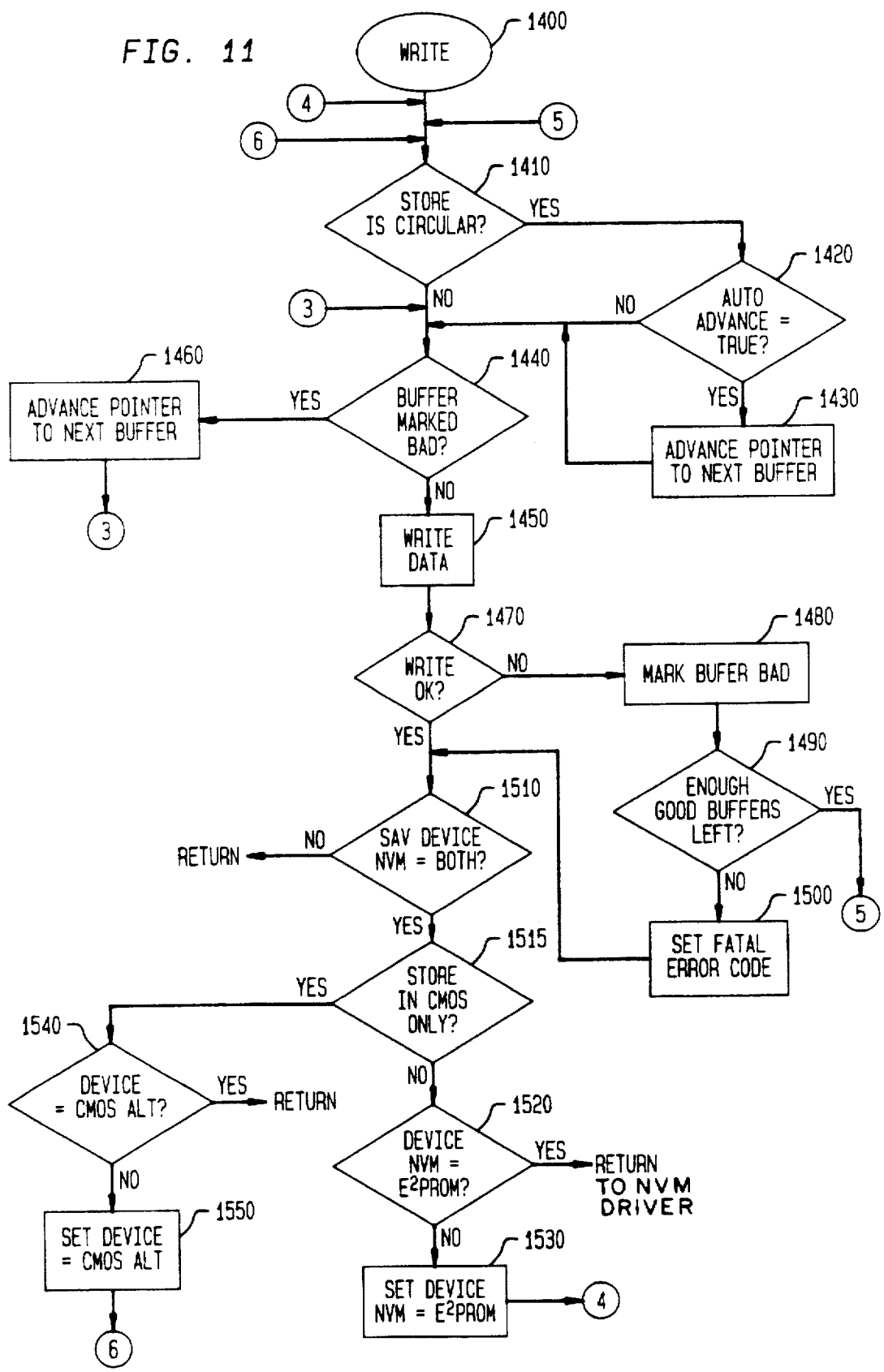
Figure 12:
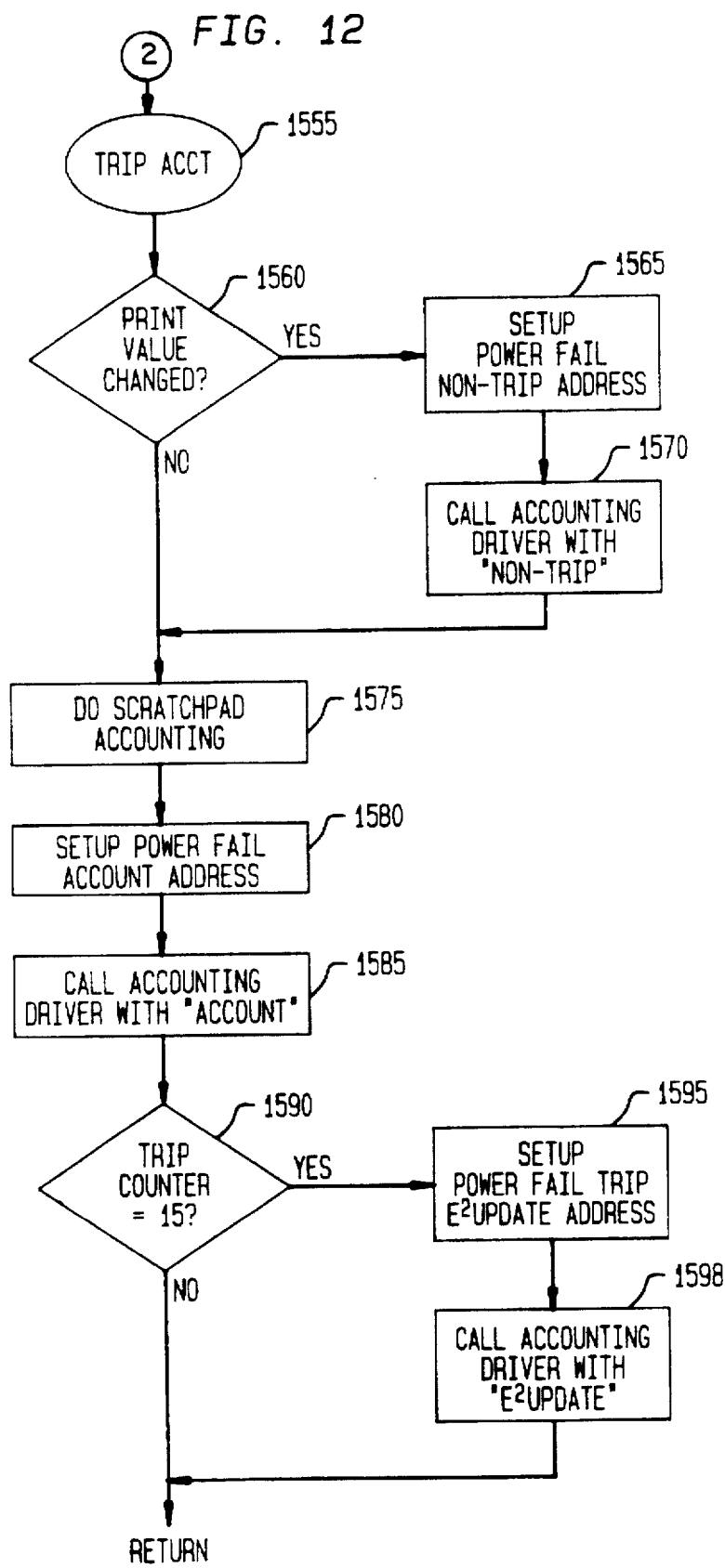
FIG. 12 is the flow chart illustrating the accounting for a postage meter print operation.

FIGS. 5A and 5B through FIG. 11 illustrate a flow chart of the accounting driver routine 400 in the postage meter for accounting for postage meter funds and for updating non-volatile memory in accordance with the trip routine discussed in conjunction with FIG. 12. It will be understood that other postage meter CPU routines will control performance of the other tasks required for tasks such as setting the printwheels, allowing postage to be printed by energizing and de-energizing the die-protection solenoids, communicating with peripherals and the like. It will be understood that these tasks may be performed in sequences as described in U.S. Pat. No. 4,301,507 and 4,710,883.

Figure 5A:
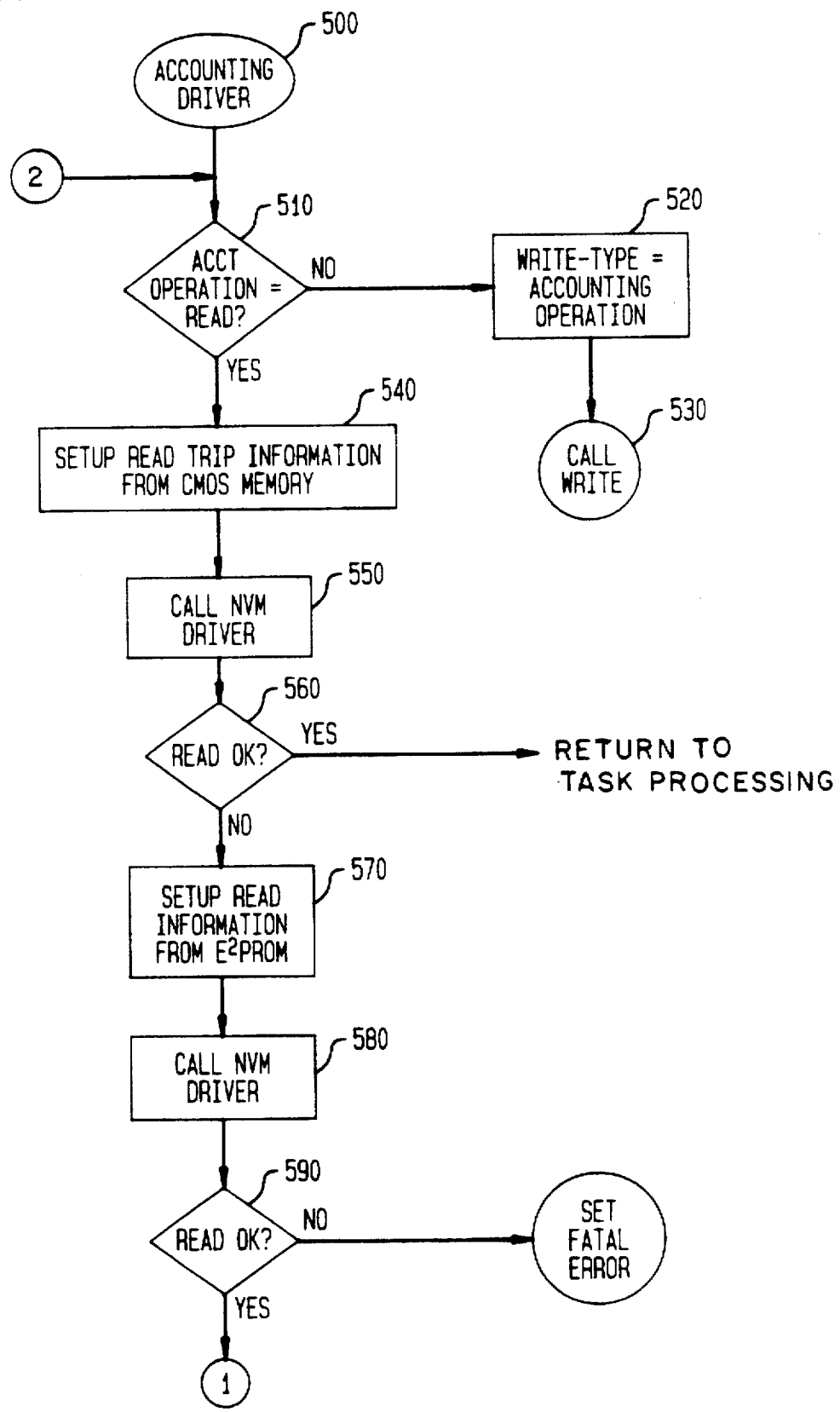
FIGS. 5A, 5B, 6–9, 10A, 10B, and 11 comprise a flow chart illustrating the postage meter accounting and non-volatile memory access routine in accordance with the invention.
Figure 5B:
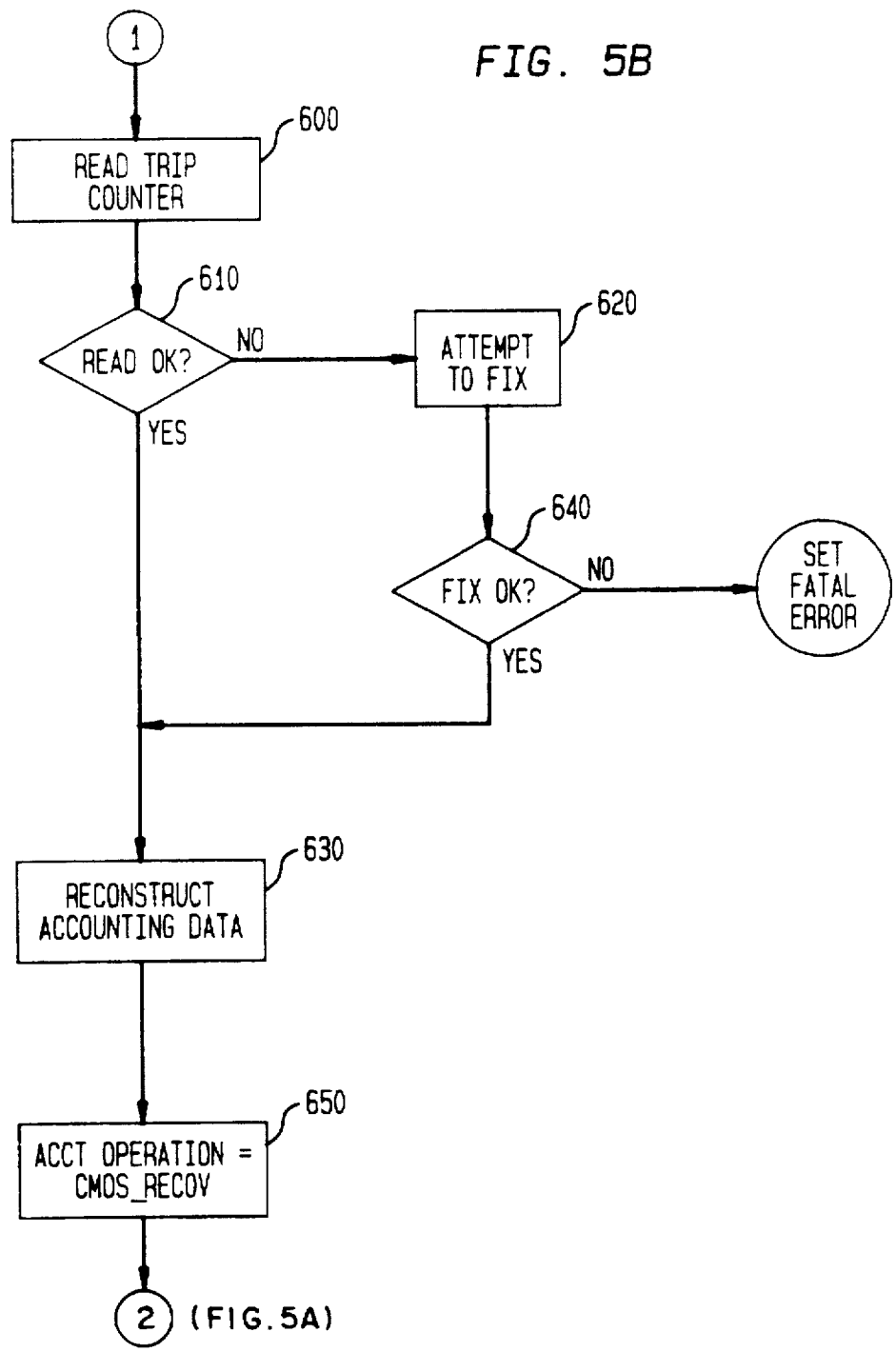

FIGS. 5A and 5B comprise a flow chart illustrating the top-level control process for the accounting driver. The routine examines an ACCT-OPERATION input and passes control to either the Read Trip or Write Trip routine. If the Read Trip routine returns a status of CMOS.RECOVERY, control is again passed to the Write Trip routine to perform the recovery of CMOS data. In all other circumstances, the status from Read Trip routine or the Write Trip passes control back to Task Processing.

In the ACCOUNTING DRIVER routine 500, as shown in FIG. 5A, the ACCT-OPERATION input is tested in decision block 510. If the ACCT-OPERATION=READ is negative, the WRITE-TYPE=ACCOUNTING OPERATION is selected, block 520 and the WRITE TRIP subroutine is called at block 530. The WRITE TRIP routine is discussed below.

Continuing again from decision block 510, if the TEST for ACCT-OPERATION=READ is YES, the routine attempts to READ the current trip information store from NVM. It will first try to retrieve the data from the CMOS memory 104. If the data cannot be retrieved, the routine attempts to get the trip data from E²PROM memory 106. In the event that this retrieve is required, the accounting values are reconstructed as discussed previously by multiplying the count stores in the E²PROM trip counter by the set postage value stored in the trip data.

The routine proceeds to set up to READ the trip information from the CMOS NVM 104, block 540, and the NVM DRIVER routine is called, block 550, to READ the information stored in the CMOS memory buffers. If the status after the READ has been completed returns as OK, block 560, the program control is returned to task processing. If the READ status checked at block 560 is not OK, then the routine sets up to READ the information from the buffers of the E²PROM memory, block 570 and NVM DRIVER is again called at 580 to READ the E²PROM.

If the status of this READ out of the E²PROM, checked at decision block 590 is not OK, a fatal error flag is set since both devices cannot be read and meter fatal error processing is initiated to shut down the postage meter. If status of this Read at block 590 is OK, then the Trip Counters in the E²PROM memory are READ, block 600, and the result of this READ is tested at decision block 610.

In the event that the READ is OK, the routine proceeds to reconstruct the accounting data in RAM for the CMOS memory from that in the E²PROM, block 630.

If the READ of the trip counters is not OK, the routine attempts to fix corrupted print count data by copying the data stored in the random access memory into a new buffer in the E²PROM, block 620. The fix is tested at decision block 640. If it is not achieved, a FATAL ERROR is set since both memories again cannot be READ.

However, if the appropriate fix has been achieved, the routine proceeds as well to block 630 to reconstruct CMOS data as noted previously. The ACCT.OPERATION is set to CMOS-RECOV, block 650, and the routine loops back.

Figure 6:
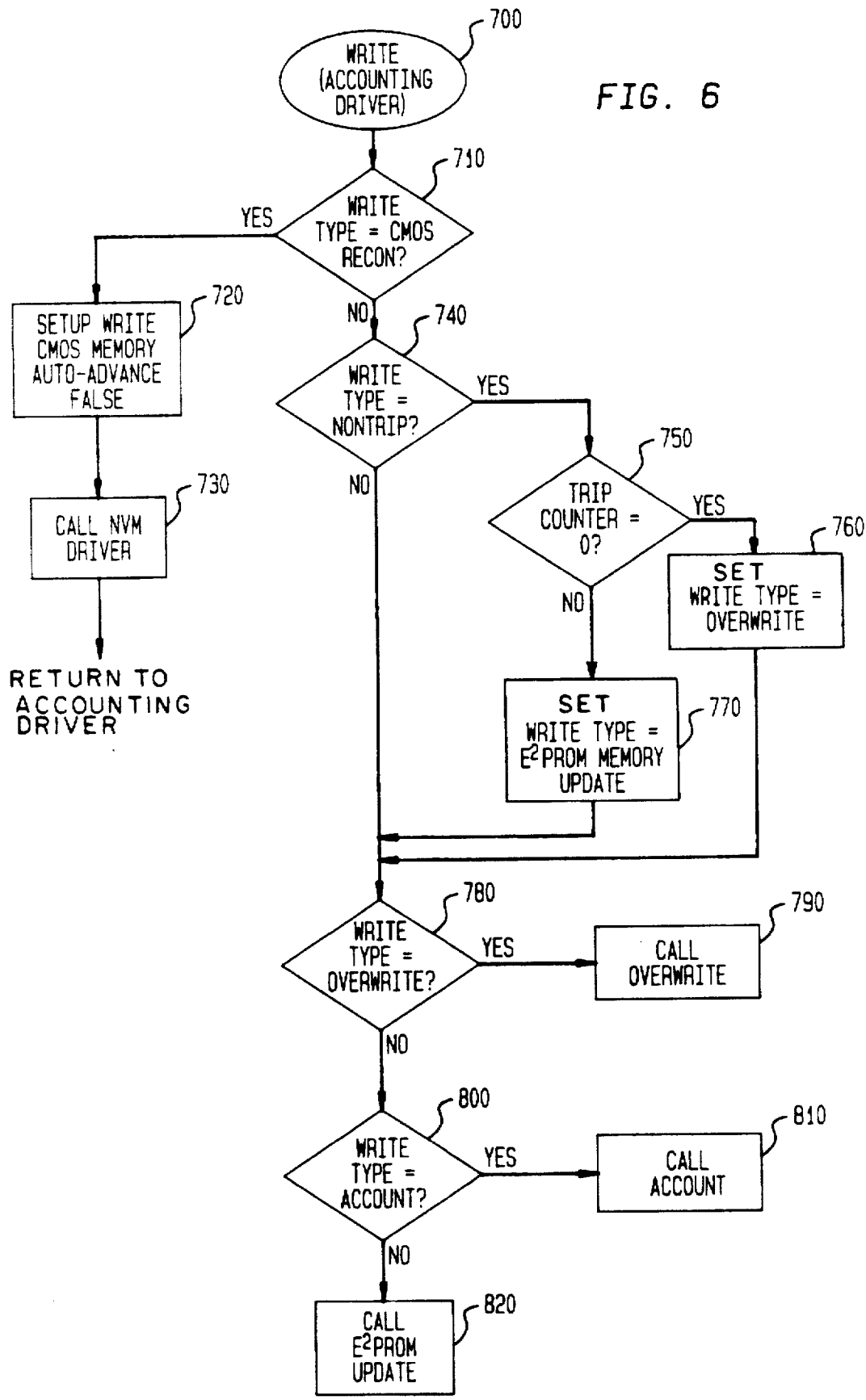

FIG. 6 shows the WRITE subroutine for the accounting driver at 700. At decision block 710, the WRITE TYPE is tested and if the CMOS RECONSTRUCT is set, the YES branch of the decision block 710 sets up the WRITE CMOS memory with the "Auto-Advance to the next buffer" set to false at block 720. At block 730, the NVM DRIVER routine is called to overwrite the CMOS accounting data as described previously with the accounting driver routine. The program then returns to the accounting driver routine.

Returning to decision block 710, if the WRITE-TYPE is not equal to CMOS reconstruct, the NO branch is selected and the routine tests for whether the WRITE-TYPE is a non-trip, block 740. Such non-trip accounting is called for, for example, when the requirement is to clear a batch register, set postage recharging information and the like. At the YES branch of decision block 740, that is, when the WRITE-TYPE equals non-trip, the routine progresses to check the trip counters in the E²PROM memory, block 750. If the trip counters are set equal to zero, the YES branch proceeds to set the WRITE-TYPE equal to OVER-WRITE, block 760 and returns to the main line of the WRITE Accounting Driver routine. In the event that the trip counter is not equal to zero, the NO branch sets the WRITE-TYPE equal to E²PROM Memory Update, block 770, and returns to the mainline of the WRITE Accounting Driver routine.

Returning to decision block 740, if the WRITE-TYPE equal non-trip is NO, the NO branch proceeds directly to test whether the WRITE-TYPE is equal to OVER-WRITE, decision block 780. If the WRITE-TYPE equals OVER-WRITE, the YES branch proceeds to call the OVER-WRITE subroutine, block 790. If the WRITE-TYPE does not equal OVER-WRITE, the NO branch of decision block 780 falls to block 800 to check whether the WRITE-TYPE equals ACCOUNT. If the WRITE-TYPE is equal to ACCOUNT, the YES branch of decision block 800 proceeds to call the ACCOUNT routine, block 810. If the WRITE-TYPE does not equal ACCOUNT, the NO branch of block 800 proceeds to call the E²PROM MEMORY UPDATE routine, block 820.

Figure 7:
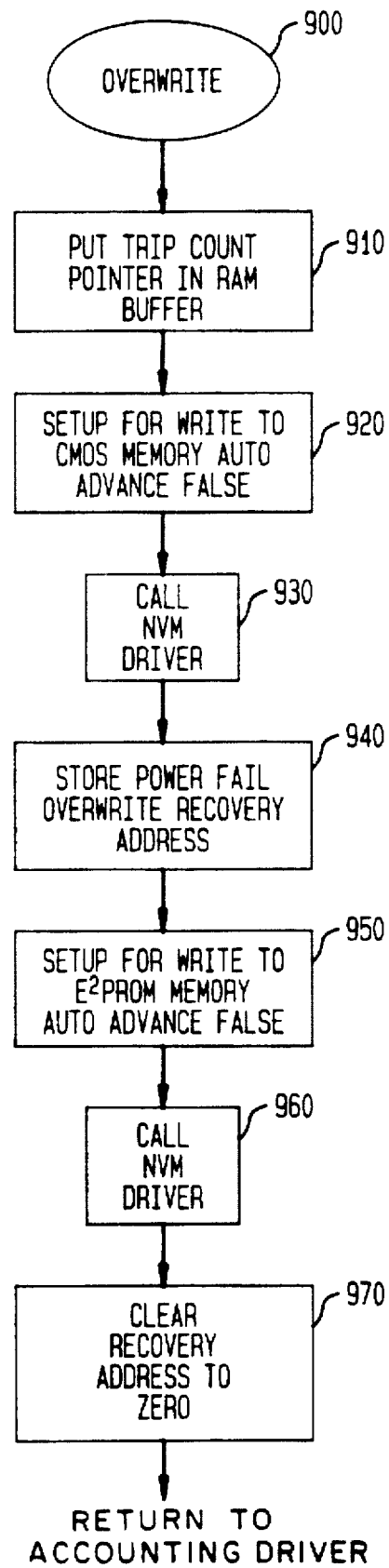

FIG. 7 illustrates the OVER-WRITE routine at 900. This routine serves to simply copy data from RAM buffers into the data store in a particular non-volatile memory. This routine begins at block 910 by placing the trip count pointer into the RAM buffers. The program sets up, at block 920, for the WRITE to the CMOS memory with the Auto-Advance flag set false. That is, the buffers in CMOS memory will simply be overwritten by the data in corresponding RAM buffers.

The NVM DRIVER routine is then called at block 930 to WRITE the data to CMOS and when it returns successfully, an update recovery address which has been previously set will be cleared at 940. The purpose of this block 940 will be discussed below in conjunction with TRIP ACCOUNTING and power-up of non-volatile memory. The routine proceeds to block 950 to set up for writing to the E²PROM memory, again with the Auto-Advance set to false. The non-volatile memory driver is called at 960 and the recovery address is cleared at block 970. The routine then returns to the ACCOUNTING DRIVER routine.

Figure 8:
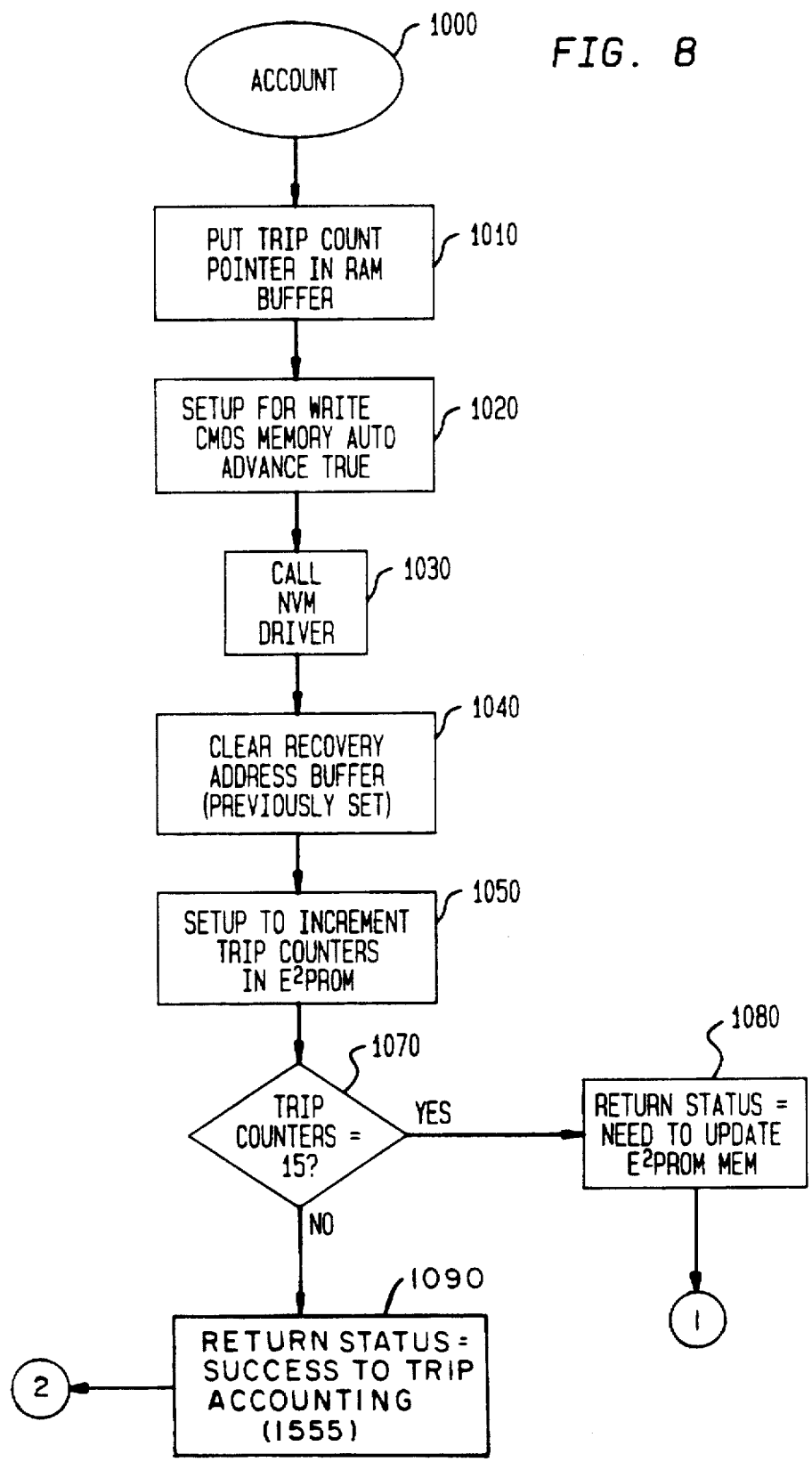

FIG. 8 illustrates the ACCOUNT routine beginning at 1000. The routine is initiated by putting the trip count pointer in RAM buffer, block 1010 and it proceeds to set up for writing to the CMOS memory with, in this case, the Auto-Advance being true, block 1020. The non-volatile memory driver is called to WRITE the CMOS block 1030 and upon successful completion of the WRITE, the recovery address is cleared, block 1040. The program proceeds to set up to increment the trip counters in the E²PROM, block 1050, and the trip counters are tested at decision block 1070 to determine whether the trip counter has reached a predetermined number, suitably 15, for the E²PROM used in the present postage meter. If the trip counters have reached 15, the YES branch returns a status of "Need-to-Update E²PROM memory" to the calling module, block 1080, and the program returns to the WRITE Accounting Driver routine to call the UPDATE E²PROM routine. If the trip counter value does not equal 15, the NO branch of decision block 1070 returns to the TRIP ACCOUNTING routine with a status indicating success block 1090.

Figure 9:
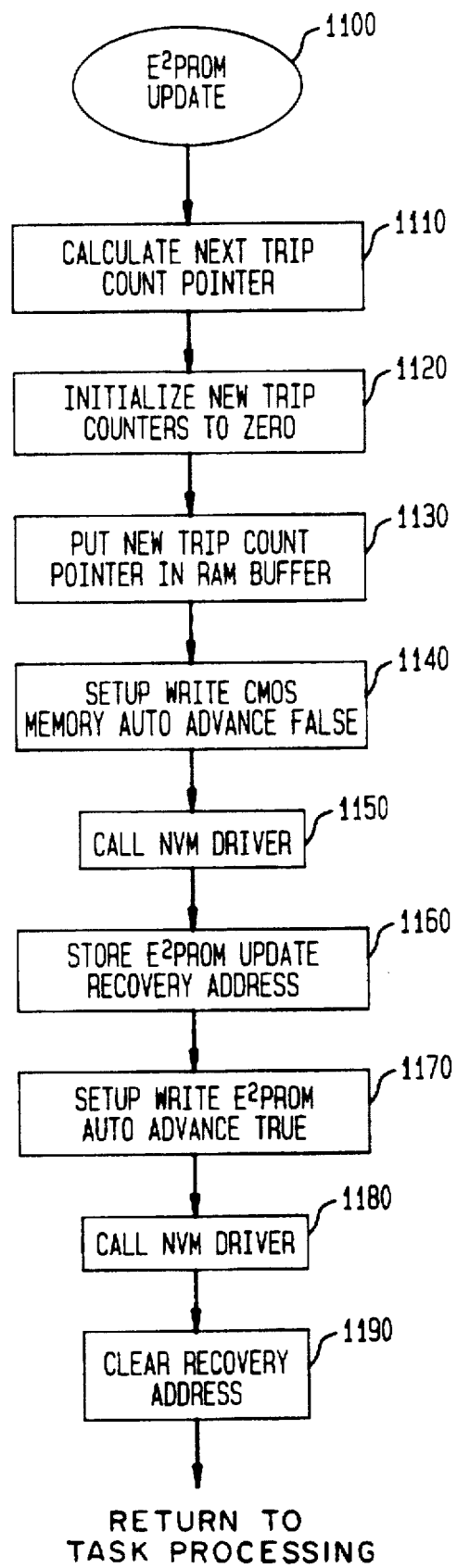

The UPDATE OF E²PROM routine is shown in FIG. 9 beginning at 1100. This routine proceeds at block 1110 to calculate the next Trip Count pointer and to initialize new trip counters to zero, block 1120. The new Trip Count pointer is then stored in the RAM buffer, block 1130 and the set up to WRITE CMOS memory with the Auto-Advance false is made, block 1140. The NVM DRIVER is called at block 1150 to WRITE to the CMOS memory and an update to the recovery address with Power Fail Acct-E²PROM Update is made at block 1160, after successful completion of the WRITE to CMOS memory. The WRITE from RAM to E²PROM memory with the Auto-Advance set to TRUE is carried out at block 1170, the NVM DRIVER is called at block 1180 and finally, the recovery address buffer is cleared at block 1190. The routine then returns to TRIP ACCOUNTING.

Turning now to FIG. 10, the NVM DRIVER routine is shown at 1200. A routine called NVM DRIVER may elect to read information from the CMOS memory, from the E2 PROM memory or from both memories. As seen from Table 1, the NVM devices are numbered. In this routine, at block 1210, save device non-volatile memory equals device number. This number is tested at block 1220 and if the number corresponding to "BOTH DEVICES" is selected, the YES branch of the block proceeds to choose the Device Number equals CMOS at block 1230 to initiate the routine.

Next, at block 1240, the operational flag is tested to see whether a READ operation is requested, and if not, the NO branch of decision block 1240 calls the WRITE routine (for non-volatile memory driver) at block 1250. The YES branch of decision block 1240 proceeds to check whether the buffer to be read is marked BAD at decision block 1260. The NO branch of this decision block 1260 indicates that the buffer is not BAD and the program proceeds to READ the data from the selected non-volatile memory device at block 1270.

The READ is tested at decision block 1280 and if it is OK, the YES branch returns to the ACCOUNTING DRIVER program. If the READ was not OK, the buffer is marked BAD, block 1290 and a test is made if there are sufficient GOOD buffers left at block 1300. If there are sufficient buffers, the YES branch sets a non-fatal error code at 1310. If there are not sufficient GOOD buffers left, the NO branch proceeds to set a fatal error code at 1320 and both branches then proceed to decision block 1330 where the SAVE DEVICE NUMBER is again tested to see if it was set to read "BOTH DEVICES".

Returning again to decision block 1260, if the answer is that the buffer was marked BAD, an error code is set at block 1265 and a return is made to the main line as above to test at block 1330 whether the device NVM is equal to "BOTH". The NO branch of this decision block 1330 returns an error code. If the answer is YES, the device number is checked to see whether it is equal to CMOS ONLY at decision block 1345. If NO, the DEVICE NUMBER is checked to see whether it is equal to $E^2PROM$ at decision block 1350.

The NO branch of decision block 1350 proceeds to block 1360 where the device is set equal to $E^2PROM$ and a return is made to check whether the buffer is marked BAD at decision block 1260. If the selected branch at decision block 1350 is YES, a fatal error code is set at block 1370 and the error code is returned.

Returning to decision block 1345, if the answer is YES, the YES branch proceeds to decision block 1380 to determine if the CMOS Memory Alternate is set. If it is, the routine returns. If NO, the NO branch proceeds to set the device equal to CMOS ALT, block 1390 and loops back for reading the data.

The WRITE routine for non-volatile memory driver is illustrated in FIG. 11 at 1400. When the WRITE is called, the store code is tested at block 1410 to determine if the store is circular. If the store is circular, the YES branch leads to a test in decision block 1420 whether the Auto-Advance to set to TRUE. If Auto-Advance is TRUE in block 1420, the YES advances the pointer to the next buffer, block 1430 and returns to the main line. Similarly, if the test of the Auto-Advance in block 1420 is NO or if the store is not circular, the NO branch proceeds to the main line to decision block 1440 to determine if the buffer is marked BAD, decision block 1440.

If the buffer is not BAD, the NO branch at decision block 1440 proceeds to the WRITE data block 1450. If the buffer is marked BAD, the YES branch proceeds to block 1460 which advances the pointer to the next buffer, block 1460, and loops back to test the buffer at block 1440.

The WRITE is tested at decision block 1470 and if it is not GOOD, the NO branch proceeds to block 1480 to mark the buffer BAD and the test is made at block 1490 to determine whether there are sufficient GOOD buffers are left for operation. The YES branch of decision block 1490 loops back to the start of the WRITE program.

If there are not sufficient GOOD buffers, the NO branch proceeds to set a fatal error code at block 1500 and rejoins the main line at the YES branch from decision block 1470. In either event, the SAVE DEVICE NVM number is checked to see whether it is equal to BOTH DEVICES, block 1510 and if the answer is NO, the NO branch returns to the NVM DRIVER routine. If the answer at decision block 1510 is YES, the YES branch proceeds to decision block 1515 to determine if the store is to CMOS Memory Only. If the CMOS Memory Only is set, the YES branch of decision block 1515 proceeds to decision block 1540 to test whether CMOS.ALT is set. If it is, the routine returns, to the NVM Driver routine; if no, the NO branch from block 1540 sets the device equal to CMOS Alternate, block 1550, and loops back.

Returning to decision block 1515, if the answer is NO, the routine falls to decision block 1520 to test whether the device number is equal to $E^2PROM$ at block 1520. If the answer is YES, the routine again returns to the main NVM DRIVER routine and if not, the device number is set equal to $E^2PROM$ block 1530 and the program loops back to the start of the WRITE routine.

We are now in position to discuss the actual trip accounting process. FIG. 12 is a flow chart of the accounting and NVM update which is required for each "trip" or print of postage value. The printwheels will have either remained in a previously set condition or have been changed to a new postage setting by a communication from the operator or a peripheral device. As discussed previously, every time postage is printed, the following information has to be updated within the postage meter non-volatile memories to account for the printing of the postal value set on the printwheels: the ascending register, descending register, piece count, batch count, and batch amount. The ascending register accounts for the total amount of money expended by the postage meter whereas the descending register accounts for the funds remaining in the postage meter. Piece count, batch count and batch amount are normally set to zero at the start of a run so that the number of envelopes to which postage is applied. The batch amount and batch count are normally resettable to zero by the operator to allow the operator to keep track of the actual postage used during a current run as well as the number of pieces in the run.

An additional value stored in accordance with the invention is the value of postage to which the printwheels are set.

The first step in the trip account routine 1555 is therefor to perform a check of the setting of the printwheels to determine whether there has been a change in the set value since the last meter trip, block 1560. If there has been a change, the YES branch proceeds, block 1565, to place a Power Fail-Non Trip recovery address into a main and alternate buffer in CMOS NVM 104. The ACCOUNTING DRIVER routine is then called, with parameter set to NON-TRIP, block 1570, to update the data stores, both in the CMOS and in the $E^2PROM$. During the course of a successful memory update, the recovery address buffer is cleared and the program returns to join the NO CHANGE branch from block 1560.

The next step, block 1575, is to perform a scratch pad accounting in RAM. The newly computed ascending and descending register information, etc., is placed in RAM buffers for transfer to corresponding buffers in the NVMs.

It will be appreciated that this is a critical moment because when power to the electronic postage meter is lost, the contents of this temporary memory is lost. To avoid the loss of critical information as the status of critical data changes, it is now immediately transferred to NVM. In order to protect the data transfer, in accordance with the invention, each time such an update to the CMOS non-volatile memory is required, there is set up a Power Fail-Account Recovery address as shown in block 1580. This address is a pointer to a program in ROM which will cause the postage meter program to call a routine to restart in power-up from the initial point of the TRIP ACCOUNTING in order to cycle through the routine from the beginning of the trip. No attempt is made to continue the accounting from the exact point of power fail. For best results, the Power Fail Trip recovery address is stored both in a main and an alternate memory buffer in CMOS memory along with a CRC for each.

The next block, 1585 calls the ACCOUNTING DRIVER (500) for the accounting process. It will be remembered that in the discussion of the ACCOUNTING DRIVER routine, the significance of the clearing of this Power Fail Account address was not specifically discussed. Here it becomes evident that the address set in this TRIP ACCOUNTING routine will allow recovery by returning the calculations to the start of this trip even if the update process has been nearly completed. The address is then cleared once the NVM memory update has been completed.

When ACCOUNT returns to the Trip routine, the status of the Trip Counter is checked, decision block 1590, if the counter has not reached 15, the NO branch of the routine returns to Task Processing. If the counter has reached 15, the YES branch of decision block 1590 proceeds to set up a Power Fail-Trip E²PROM UPDATE address, block 1595, and to invoke the ACCOUNTING DRIVER with parameter set to E²PROM UPDATE, block 1598. After a successful WRITE, the TRIP routine returns to Task Processing.

Figure 13:
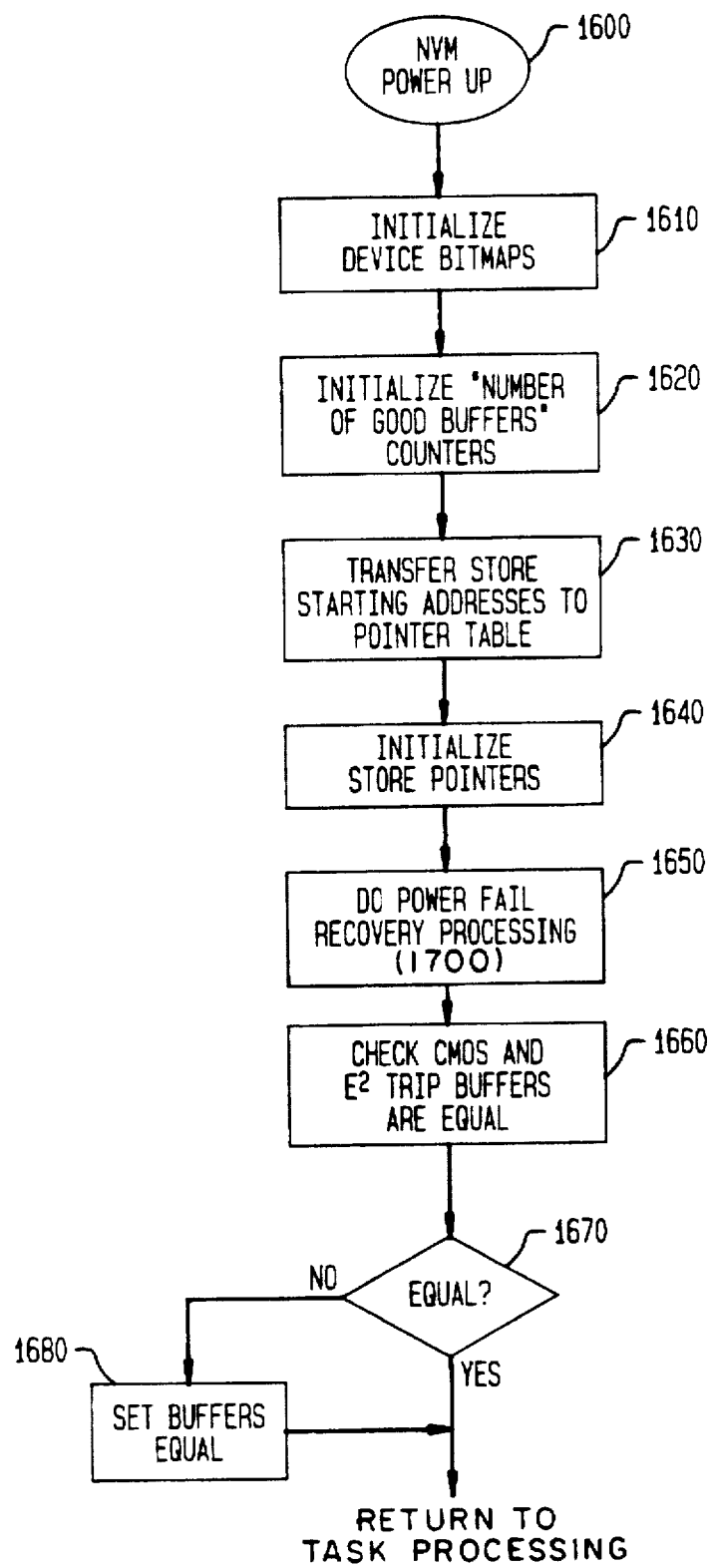
FIGS. 13–14 comprise a flow chart illustrating the power up procedure of the non-volatile memories in accordance with the invention.
Figure 14:
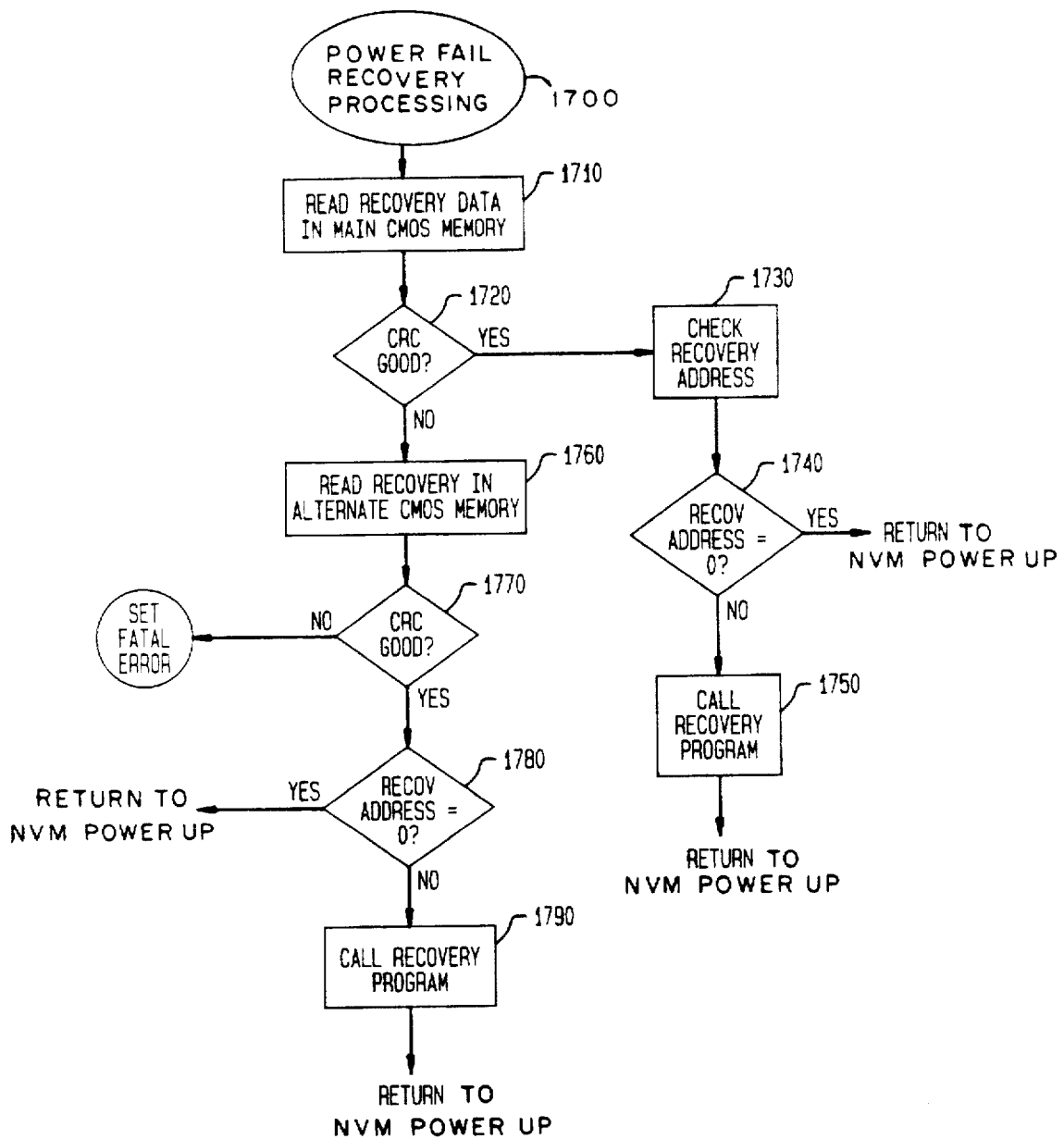

FIGS. 13 and 14 comprise a flow chart illustrating the power-up procedure of the accounting portions of non-volatile memory. In FIG. 13, the NVM power-up routine is shown at 1600. A power-up flag is checked and the routine initializes the device bit map, block 1610. It will be recalled that each device maintains four (4) copies of the bit map in its lower address registers. The first GOOD copy is determined and the bit map for each device is transferred to RAM. At block 1620, the counters representing the numbers of GOOD buffers are READ from non-volatile memory. Next, at block 1630, the starting addresses for the stores are transferred to RAM. It will be appreciated that this was the initial address data that is placed in ROM. The next step is to initialize the store pointers at block 1640 based upon the current non-volatile memory status and bit maps initialized in block 1610.

The routine then proceeds at block 1650 to the POWER FAIL recovery processing. The routine then falls to block 1660 where the CMOS and E²PROM trip buffers are checked to determine whether the buffers are equal. If at decision block 1670, the E²PROM and CMOS are not equal, the NO branch proceeds to set the buffers equal using the copy with the highest piece count, block 1680, and returns to the application program, otherwise, the routine returns directly to application program at the YES branch.

FIG. 14 shows the power-fail processing at 1700. It will be recalled that the recovery addresses are stored in a main and alternate buffer in CMOS memory. The power-up processing routine reads the recovery data in the main CMOS memory block 1710 and if the CRC is GOOD at decision block 1720, the YES branch proceeds to block 1730 to check the recovery address. If the recovery address equals zero at block 1740, there is no indication of incomplete accounting and the YES branch returns to main NVM power-up program.

If the check says that the recovery address is not zero at decision block 1740, the NO branch causes a call of the recovery routine at the recovery program address in non-volatile memory, block 1750. Returning to decision block 1720, if the CRC is determined not be GOOD, the NO branch falls to block 1760 to read the recovery data in the alternate CMOS register. The CRC is checked in block 1770 and if it is also found not GOOD, the NO branch sets a fatal error since neither memories' recovery data can be read.

If, however, the CRC is GOOD on this decision block 1770, the YES branch falls to decision block 1780 to determine whether recovery address is equal to zero. If YES, the routine returns to NVM power-up since no further action is required. If the recovery address is not zero, the NO branch causes a jump to recovery program address stored in the non-volatile memory block 1790.

The Appendix comprising Table 1 is attached hereto. Table 1 illustrates the memory store definitions in accordance with the invention.

TABLE 1

STORE DEFINITION

MEMORY_SPEC is a ROM store which holds descriptive information about RAM and NVM memory layout
MEMORY_SPEC = STORE_SPEC + BITMAP_SPEC
* STORE_SPEC holds descriptive information about all data stores in both NVM devices which are accessed via the NVM driver software. Since the data store EEPROM_TRIP_CNT is not accessed via the NVM driver software, it does not have an entry in STORE_SPEC. *
STORE_SPEC = { { STORE_DESC }8 }2
* STORE_DESC holds descriptive information about a particular data store within a particular NVM device *
STORE_DESC = START_ADDR + END_ADDR + ORG_TYPE + MIN_GOOD_BUFFS + LENGTH + CMOS_ONLY
START_ADDR = "address"
END_ADDR = "address"
ORG_TYPE = ["ascend" | "circular"]
MIN_GOOD_BUFFS = "1 byte count"
LENGTH = "1 byte count"        * NOTE: does not include CRC *
CMOS_ONLY = ["true" | "false"]
BITMAP_SPEC = RAM_BITMAP_ADDR + NVM_BITMAP_ADDR + BITMAP_LEN
* RAM_BIT_ADDR stores the RAM addresses of the bitmaps for both NVM devices *
M_BITMAP_ADDR = {"address"}2
NVM_BIT_ADDR stores the NVM addresses of each of the 4 copies of the bitmap for both NVM devices *
M_BITMAP_ADDR = { {"address"}4}2
BITMAP_LEN stores the length of the bitmap (NOT including CRC) for both NVM devices *
BITMAP_LEN = {"1 byte count"}
ACCESS_INFO contains dynamically changing information about acceptable access to memory structures
ACCESS_INFO = STORE_ACCESS + BITMAP_ACCESS
STORE_ACCESS = PTR_TABLE + NUM_GOOD_BUFFS + RAM_BITMAP
BITMAP_ACCESS = BAD_BITMAP + RAM_BITMAP
UPD_BAD_ACCESS = BITMAP_ACCESS + NUM_GOOD_BUFFS
PTR_TABLE = { { "address" }9 }2 * A table in ROM containing current pointers for NVM device stores. An entry is kept for each store represented in RAM_STORES plus an entry is also kept for EEPROM_TRIP_CNT. *
BAD_BITMAP = { {"1 byte flag"}4 }2
NUM_GOOD_BUFFS = { {"1 byte count" }9}2
* an entry for each store represented in RAM_STORES plus an entry for EEPROM_TRIP_CNT *
RAM_BITMAP = { BITMAP }2 * RAM_BITMAP is a RAM store which contains the most current copy of the bitmap for both NVM devices *
BITMAP = { "byte" }32 * each bit in BITMAP signifies whether a TABLE 1-continued

STORE DEFINITION

```
given segment is good or bad within a
specific NVM device *
RAM_FLAGS is a control store which contains flags indicating
the status of the NVM devices
RAM_FLAGS = CMOS_BAD + EEPROM_BAD
CMOS_BAD = [ "true" | "false"]
EEPROM_BAD = [ "true" | "false"]
Each NVM data store will have a corresponding buffer in
RAM_STORES for use when reading or writing to the devices.
RAM_STORES = TRIP_INFO + RECOV_INFO +
RECHARGE_INFO + PARAM_INFO + FATAL_INFO +
CONFIG_INFO + NON_CRIT_1
CMOS_DEVICE = CMOS_BITMAP + CMOS_STORES
CMOS_STORES = TRIP_INFO + {RECOV_INFO}2 +
RECHARGE_INFO + PARAM_INFO + FATAL_INFO + CONFIG_
INFO + {NON_CRIT_1}2
EEPROM_DEVICE = EEPROM_BITMAP + EEPROM_STORES
EEPROM_STORES = TRIP_INFO +
RECHARGE_INFO + PARAM_INFO + FATAL_INFO +
CONFIG_INFO + EE_TRIP_CNT
NVM_BITMAP = [CMOS_BITMAP | EEPROM_BITMAP]
CMOS_BITMAP = BITMAP
EEPROM_BITMAP = BITMAP
TRIP_INFO = MEMORY_BUFFER
RECOV_INFO = MEMORY_BUFFER
RECHARGE_INFO = MEMORY_BUFFER
PARAM_INFO = MEMORY_BUFFER
FATAL_INFO = MEMORY_BUFFER
CONFIG_INFO = MEMORY_BUFFER
NON_CRIT_1 = MEMORY BUFFER
MEMORY_BUFFER = {"byte"}32
EE_TRIP_CNT = { "2 bytes"} 1280
* Each data store will be assigned a reference number *
STORE_NAME = |TRIP_STORE | RECOV_
STORE | RECHARGE_STORE | PARAM_STORE
| FATAL_STORE | CONFIG_STORE | NONCR1_STORE |
EE_TRIP_CNT_STORE ]
TRIP_STORE = "0"
RECOV_STORE = "1"
RECHARGE_STORE = "2"
PARAM_STORE = "3"
FATAL_STORE = "4"
CONFIG_STORE = "5"
NONCR1_STORE = "6"
EE_TRIP_CNT_STORE = "7"
DEVICE_PARAM = [ CMOS | EEPROM | BOTH | CMOS_ALT ]
DEVICE_NUM = [ CMOS | EEPROM ]
PTR_DEVICE_NUM = [CMOS | EEPROM ]
CMOS = "1"
EEPROM = "2"
BOTH = "3"
CMOS_ALT = "4"
DEV_AND_STORE = DEVICE_NUM + PTR_DEVICE_
NUM + STORE_NAME
READ_PARAMS = AUTO_BAD_UPD + AUTO_
RECOV + DEV_AND_STORE
WRITE_PARAMS = AUTO_ADV + DEV_AND_STORE
DRIVER_PARAMS = OPERATION + STORE_NAME +
DEVICE_PARAM + [AUTO_ADV | AUTO_RECOV]
OPERATION = ["read" | "write"]
AUTO_RECOV = [ "true" | "false" ]
AUTO_BAD_UPD = [ "true" | false" ]
AUTO_ADV = [ "true" | "false" ]
```

What is claimed is:

1. A method for organizing data in a postage meter microcontrol system, said postage meter microcontrol system having a plurality of non-volatile memory, a CPU and a Read Only Memory (ROM) comprising the steps of:

(a) allocating a plurality of data stores for a first one of said non-volatile memories, each data store having a plurality of buffers, said plurality of buffers containing related data items;

(b) allocating a plurality of data stores for a second one of said non-volatile memories, each data store having a plurality of buffers containing redundant data to a respective one of said buffers in said first one of said non-volatile memory;

(c) providing a data store in each of said non-volatile memories which data store includes a bit map buffer having first data therein relating to the status of each of a plurality of buffers of said respective non-volatile memory and said respective bit map buffers includes status data only for that respective non-volatile memory wherein said first data has a first state and a second state;

(d) providing and entry table of addresses in said ROM for accessing the data store in each of said respective non-volatile memories;

(e) determining a current buffer address for accessing said respective non-volatile memories in accordance with the data in said ROM table and said non-volatile memory bit map;

(f) calculating and storing an associated CRC for only those data stores having said respective first data in a first state in each of said buffers of said respective non-volatile memories wherein said CRC has a first state representing a good data store buffer and a second state representing a bad data store buffer;

(g) setting said first data to said first state when said second CRC is in a first state and, or to said second state when said CRC is in said second state; and, (h) programming said microcontrol system to access only those data stores wherein said first data is in said first state.

2. A method for organizing data in a postage meter microcontrol system, said postage meter microcontrol system having a plurality of non-volatile memory, a CPU and a Read Only Memory (ROM) comprising the steps of:

(a) allocating a plurality of data stores for a first one of said non-volatile memories, each data store having a plurality of buffers, said plurality of buffers containing related data items;

(b) providing a data store in each of said non-volatile memories which data store includes a bit map buffer having first data therein relating to the status of each of a plurality of buffers of said respective non-volatile memory and said respective bit map buffers includes status data only for that respective non-volatile memory wherein said first data has a first state and a second state;

(c) providing and entry table of addresses in said ROM for accessing the data store in each of said respective non-volatile memories;

(d) determining a current buffer address for accessing said respective non-volatile memories in accordance with the data in said ROM table and said non-volatile memory bit map;

(e) calculating and storing an associated CRC for only those data stores having said respective first data in a first state in each of said buffers of said respective non-volatile memories wherein said CRC has a first state representing a good data store buffer and a second state representing a bad data store buffer;

(f) setting said first data to said first state when said CRC is in a first state or to said second state when said CRC is in said second state; and, (g) programming said microcontrol system to access only those data stores wherein said first data is in said first state.

3. A method for organizing data in a postage meter micro control system, said postage meter micro control system having a non-volatile memory, a CPU and a Read Only Memory (ROM) comprising the steps of:

(a) allocating a plurality of data stores for said non-volatile memories, each data store having a plurality of buffers, said plurality of buffers containing related data items, (b) providing a data store in each of said non-volatile memories which data store includes a bit map buffer having first data therein relating to the status of each of a plurality of buffers of said respective non-volatile memory and said respective bit map buffers includes status data only for that respective non-volatile memory wherein said first data has a first state and a second state;

(c) providing and entry table of addresses in said ROM for accessing the data store in each of said respective non-volatile memories;

(d) determining a current buffer address for accessing said non-volatile memories in accordance with the data in said ROM table and said non-volatile memory bit map; and, (e) calculating and storing an associated CRC for only those data stores having said respective first data in a first state in each of said buffers of said non-volatile memories wherein said CRC has a first state representing a good data store buffer and a second state representing a bad data store buffer;

(f) setting said first data to said first state when said CRC is in a first state or to said second state when said CRC is in said state;

(g) programming said micro control system to access only those data stores wherein said first data is in said first state; and (h) programming said micro control system to access only those data stores wherein said first data is in said first state.

* * * * *